United States Patent [19]

Hebert

[11] Patent Number: 5,663,684

[45] Date of Patent: Sep. 2, 1997

[54] WAFER-STAGE ADJUSTMENT FOR COMPENSATING FOR MISMATCHES IN TEMPERATURE DEPENDENT IC COMPONENTS

[75] Inventor: Gary K. Hebert, Shrewsbury, Mass.

[73] Assignee: THAT Corporation, Marlborough, Mass.

[21] Appl. No.: 539,987

[22] Filed: Nov. 7, 1995

Related U.S. Application Data

[63] Continuation-in-part of Ser. No. 336,429, Nov. 9, 1994, abandoned.

[51] Int. Cl.[6] .................................................. H03F 1/30
[52] U.S. Cl. ........................ 330/289; 330/282; 330/284; 330/307
[58] Field of Search .............................. 330/256, 266, 330/272, 289, 307, 278, 282, 284; 327/512, 513

[56] References Cited

U.S. PATENT DOCUMENTS

| | | |
|---|---|---|
| 3,714,462 | 1/1973 | Blackmer . |
| 4,155,047 | 5/1979 | Rubens et al. . |
| 4,225,794 | 9/1980 | Buff . |
| 4,234,804 | 11/1980 | Bergstrom . |
| 4,331,931 | 5/1982 | Adams . |
| 4,341,962 | 7/1982 | Buff . |
| 4,403,199 | 9/1983 | Blackmer . |
| 4,454,433 | 6/1984 | Welland . |
| 4,560,947 | 12/1985 | Frey . |
| 4,791,385 | 12/1988 | Wermuth .......................... 330/289 X |
| 4,823,093 | 4/1989 | Frey . |
| 5,157,350 | 10/1992 | Rubens . |

OTHER PUBLICATIONS de Haan et al. "A New Concept for Electronic Thermometers With an Intrinsic Reference", Conference: From Electronics to Microelectronics, Fourth European Conference on Electrotechnics–Eurocon '80, Stuttgart, Germany, 24–28 Mar. 1980 pp. 660–662.

Primary Examiner—James B. Mullins
Attorney, Agent, or Firm—Lappin & Kusmer LLP

[57] ABSTRACT

An integrated circuit has at least two components described in the form of two ideally matched transistors, each of which operate interdependently as a function of temperature and at least one physical parameter associated with each of said components when implemented in integrated form. The circuit further includes compensation means, disposed in the integrated circuit, for generating and applying a bipolar compensation signal to at least one of said components so that said two components interdependently operate predictably, consistently and independently of temperature variations and differences between the physical parameter of said two components. The bipolar current is necessary so that both the level and polarity of the compensation signal can be appropriately adjusted during the manufacture of the integrated circuit as a wafer so as to eliminate the need to compensate for any mismatches in the two components following such manufacture.

24 Claims, 4 Drawing Sheets

WAFER-STAGE ADJUSTMENT FOR COMPENSATING FOR MISMATCHES IN TEMPERATURE DEPENDENT IC COMPONENTS

RELATED APPLICATION

This application is a continuation-in-part of prior application, U.S. Ser. No. 08/336,429 filed Nov. 9, 1994 in the name of Gary K. Hebert and entitled Wafer-stage Adjustment for Compensating for Mismatches in Temperature Dependent IC Components now abandoned.

FIELD OF THE INVENTION

The present invention relates generally to the correction for mismatches between or among temperature dependent circuit components of an integrated circuit, and more particularly to the adjustment at the wafer stage for the correction of certain mismatches between or among circuit components which are a part of the same integrated circuit structure and which for operational purposes are required to be matched over a temperature range.

BACKGROUND OF THE INVENTION

There are many circuit designs which include circuit components, both active (such as transistors) and passive (such as resistors), which are required to be matched during their operation, over a temperature range. Where the circuits are constructed of discrete components, if necessary for optimizing system performance, adjustments typically must be made during the manufacturing process when assembling the circuits to insure component matching. This can be costly due to the labor required to make the adjustment for each manufactured circuit. Often times such adjustments provide correction only at the temperature at which the initial adjustment is made, which may not be satisfactory for other operational temperatures. In addition, some settings may be subject to shifts due to mechanical vibration. Implementing these circuits in integrated or monolithic form often necessarily requires the provision of external circuitry for providing these adjustments following the manufacture of the IC part, but does not overcome the above-noted problems.

For example, it is well known that the class of electronic gain control circuits, known as log-antilog electronic multipliers or VCAs (voltage controlled amplifiers), requires adjustment means (generally referred to as symmetry adjustment) to compensate for mismatches among the various transistors that implement the gain-control function. The requirement for such adjustment is mentioned in U.S. Pat. Nos. 3,714,462, and 4,403,199 issued to David E. Blackmer on Jan. 30, 1973 and Sep. 6, 1983 respectively; U.S. Pat. No. 4,234,804 issued to Gary Bergstrom on Nov. 18, 1980; U.S. Pat. No. 4,331,931 issued to Robert W. Adams on May 25, 1982; and U.S. Pat. Nos. 4,225,794 and 4,341,962 issued to Paul C. Buff on Sep. 30, 1980 and Jul. 27, 1982, respectively. This adjustment has historically been made via a potentiometer and associated fixed resistors, arranged to apply an adjustable potential to one or more of the bases of the transistors in the gain-control circuit. Such an adjustment method is costly due to the parts themselves, and the labor required to adjust the potentiometer during the manufacturing process of each circuit board. Further, such methods often yield a correction potential that is only correct at the temperature at which the initial adjustment was made. Finally, the potentiometer setting is subject to shifts due to mechanical vibration.

The most prevalent modern examples of such gain-control circuits are implemented in monolithic IC technology, which is well suited to these circuits as they require well-matched transistors that operate at substantially the same temperature. An example of a VCA is shown in FIG. 1.

Figure 1:
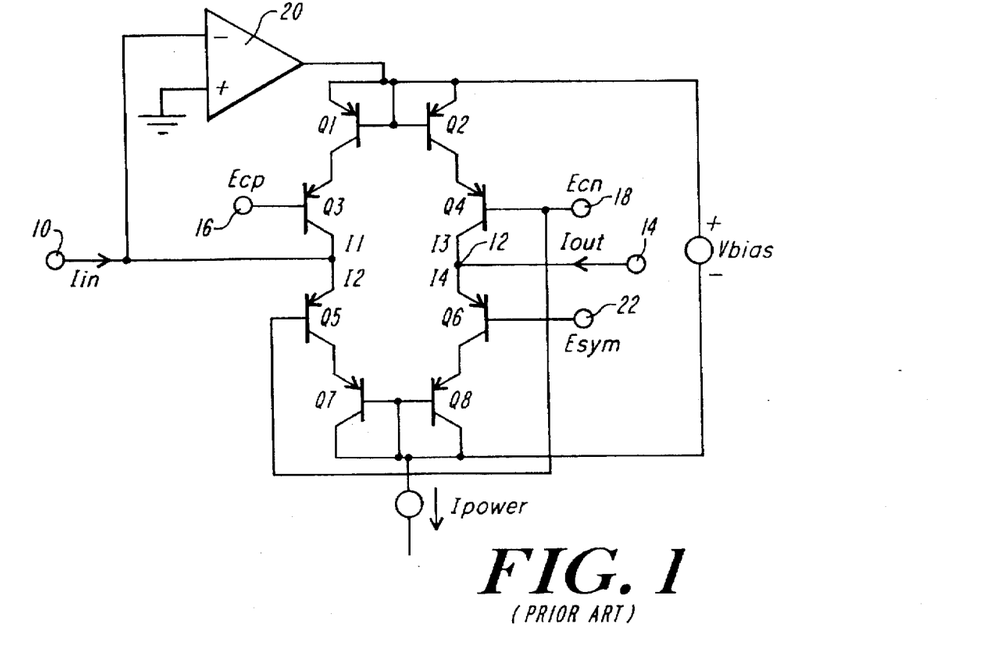
FIG. 1 is a schematic diagram of a example of a prior art gain-control circuit of the voltage controlled amplifier (VCA) type employing log-antilog pairs of transistors and showing the need for transistor symmetry adjustment.

The VCA shown in FIG. 1 includes an eight transistor cell. Eight transistor cell VCAs are known. See, for example, U.S. Pat. No. 4,331,931 issued to Robert W. Adams on May 25, 1982 and U.S. Pat. No. 4,341,962 issued to Paul C. Buff on Jul. 27, 1982. As shown in FIG. 1, an input information signal (e.g., an audio signal) $I_{in}$ is applied to the input terminal 10. Terminal 10 is connected to the collector of primary log (pnp) transistor $Q_3$ and the collector of the primary log (npn) transistor $Q_5$. The collectors of primary antilog transistors $Q_4$ and $Q_6$ (pnp and npn transistors respectively) are joined at junction 12 so as to form output terminal 14 for output current $I_{out}$. One gain control signal is applied to the positive-sense gain-control port 16 as $E_{cp}$, and to the negative-sense gain-control port 18 as $E_{cn}$. The symmetry adjust signal $E_{sym}$ is applied to the symmetry port 22. As shown, the positive control signal input terminal 16 is connected to the base of the primary log transistor $Q_3$, while the negative control signal input terminal 18 is connected to the base of primary log transistor $Q_5$ and primary antilog transistor $Q_4$. The emitter of each primary transistor $Q_3$, $Q_4$, $Q_5$ and $Q_6$ is connected to the emitter of a respective secondary transistor $Q_1$, $Q_2$, $Q_7$ and $Q_8$, with each secondary transistor being of a conductivity type opposite to that of the primary transistor to which it is connected. The bases and collectors of transistors $Q_1$ and $Q_2$ are tied together, and similarly the bases and collectors of transistors $Q_7$ and $Q_8$ are tied together. A voltage bias source $V_{bias}$ is connected between the bases and collectors of transistors $Q_1$ and $Q_2$ and the bases and collectors of transistors $Q_7$ and $Q_8$. In addition, the bases and collectors of transistors $Q_7$ and $Q_8$ are connected to a current source indicated as $I_{power}$. The input terminal 10 is also connected to the inverting input of operational amplifier 20, with the non-inverting input connected to system ground and the output connected to the bases and collectors of transistors $Q_1$ and $Q_2$.

In general, because of the logarithmic relationship between base to emitter voltage $V_{be}$ and the collector current $I_c$ of a bipolar transistor, the log transistors will provide a voltage signal at the collectors of the secondary transistors which is proportional to the logarithm of the input current. The antilog transistors will provide the output current $I_{out}$ as a function of the antilogarithm of the voltage signal. Because the control voltage $E_c$ is applied to opposing polarities of both the log and antilog transistors, varying $E_c$ will vary the ratio of the output current $I_{out}$ to the input current $I_{in}$. The symmetry adjustment signal, $E_{sym}$, is applied to the symmetry adjust terminal 22. The requirement for symmetry adjustment arises from mismatches in the base-to-emitter voltage $(V_{be})$—collector current $(I_c$ characteristics among the log and antilog transistors in the gain-control circuit. This may be seen by observing FIG. 1 and the VCA transfer function:

$$I_{out} = G \left[ \frac{I_{in}}{2} \left( e^{\frac{E_{sym}-E_{cp}}{2V_T}} \sqrt{\frac{I_{s6}I_{s8}}{I_{s5}I_{s7}}} + \sqrt{\frac{I_{s2}I_{s4}}{I_{s1}I_{s3}}} \right) + \sqrt{\frac{I_{in}^2}{2} + \frac{I_b^2}{G}} \left( e^{\frac{E_{sym}-E_{cp}}{2V_T}} \sqrt{\frac{I_{s6}I_{s8}}{I_{s5}I_{s7}}} - \sqrt{\frac{I_{s2}I_{s4}}{I_{s1}I_{s3}}} \right) \right] \quad (1)$$

wherein $I_{out}$ is the VCA output current;

$I_{in}$ is the VCA input current;

G is the nominal VCA current gain $$\left( e^{\frac{E_{cp}-E_{cn}}{2V_T}} \right);$$

$E_{cp}$ is the potential applied to the positive-sense gain-control port;

$E_{cn}$ is the potential applied to the negative-sense gain-control port;

$E_{sym}$ is the potential applied to the symmetry port;

$I_b$ is the nominal bias current in the logging and anti-logging transistors when the gain-control circuit is set for unity gain;

$$V_T = \frac{kT}{q}$$

is the "thermal voltage", a constant proportional to the absolute temperature (PTAT); and $I_{s1}$, through $I_{s8}$ are the respective saturation currents for the logging and anti-logging transistors $Q_1$ through $Q_8$.

If all of the individual log/antilog pairs of transistors ($Q_1/Q_2$, $Q_3/Q_4$, $Q_5/Q_6$, and $Q_7/Q_8$) are identically matched for their $V_{be}$-$I_c$ characteristics such that:

$$I_{s1}=I_{s2},\ I_{s3}=I_{s4},\ I_{s5}=I_{s6},\ \text{and}\ I_{s7}=I_{s8}, \qquad (2)$$

and $E_{sym}$ is set to equal $E_{cp}$, then equation (1) reduces to:

$$I_{out}=GI_{in}, \qquad (3)$$

which is the ideal case in which the output current is a linearly scaled version of the input current. In practice, however, there exist mismatches among the pairs of transistors, such that, without proper adjustment of the potential $E_{sym}$, the output current will consist of, in addition to a scaled version of the input current, second harmonic distortion and gain-dependent dc offset components represented by the second term in equation (1) reproduced as follows:

$$\sqrt{\frac{I_{in}^2}{2}+\frac{I_b^2}{G}}\left( e^{\frac{E_{sym}-E_{cp}}{2V_T}}\sqrt{\frac{I_{s6}I_{s8}}{I_{s5}I_{s7}}} - \sqrt{\frac{I_{s2}I_{s4}}{I_{s1}I_{s3}}} \right) \qquad (4)$$

These distortion and gain-dependent offset components are undesirable in high-quality audio applications, as well as other applications where a faithful scaled replica of an input signal is desired.

It is possible to properly adjust $E_{sym}$ to completely eliminate these undesirable components in the output signal. $E_{sym}$ must be adjusted such that the second term in equation (1) goes to zero. Thus, it is desirable that:

$$e^{\frac{E_{sym}-E_{cp}}{2V_T}}\sqrt{\frac{I_{s6}I_{s8}}{I_{s5}I_{s7}}} = \sqrt{\frac{I_{s2}I_{s4}}{I_{s1}I_{s3}}} \qquad (5)$$

Solving for $E_{sym}$:

$$E_{sym} = E_{cp} + 2V_T \ln \sqrt{\frac{I_{s2}I_{s4}I_{s5}I_{s7}}{I_{s1}I_{s3}I_{s6}I_{s8}}} \qquad (6)$$

In practice the transistor matching achievable with modern IC processes is such that the desired $E_{sym}$ potential is no more than a few millivolts different from $E_{cp}$, with $E_{cp}$ typically being in the range of $-700$ to $+400$ millivolts. Thus, it is convenient to consider the difference between these two potentials:

$$E_{adj} = E_{sym} - E_{cp} = 2V_T \ln \sqrt{\frac{I_{s2}I_{s4}I_{s5}I_{s7}}{I_{s1}I_{s3}I_{s6}I_{s8}}} \qquad (7)$$

as the desired adjustment potential. From the foregoing it can be seen that because $V_T$ is proportional to absolute temperature, the required $E_{adj}$ also must be proportional to absolute temperature (PTAT).

It should be noted that the circuit used in deriving the equations above is used for illustrative purposes. The effects of base currents, Early effect, and non-ideal log conformance due to finite ohmic base and emitter resistances in the logging and anti-logging transistors have been ignored for clarity. The techniques taught in U.S. Pat. No. 4,234,804 (Bergstrom) and U.S. Pat. No. 4,403,199 (Blackmer) to mitigate the effects of finite ohmic base and emitter resistances in the logging and anti-logging transistors are entirely compatible with the invention to be described, and in fact serve to bring the behavior of actual gain-control circuits closer to the ideal behavior of the simple circuit described in FIG. 1. The same is true of the technique taught in U.S. Pat. No. 4,454,433 (Welland) for mitigating the effects of Early effect mismatch among the log and antilog transistors. For gain-control circuits utilizing a cell of only four transistors, such as that described in U.S. Pat. No. 3,714,462 (Blackmer), it is easily shown that the required $E_{adj}$ is of the same form as that of equation (7) and that the present invention is equally applicable to such circuits.

Figure 2:
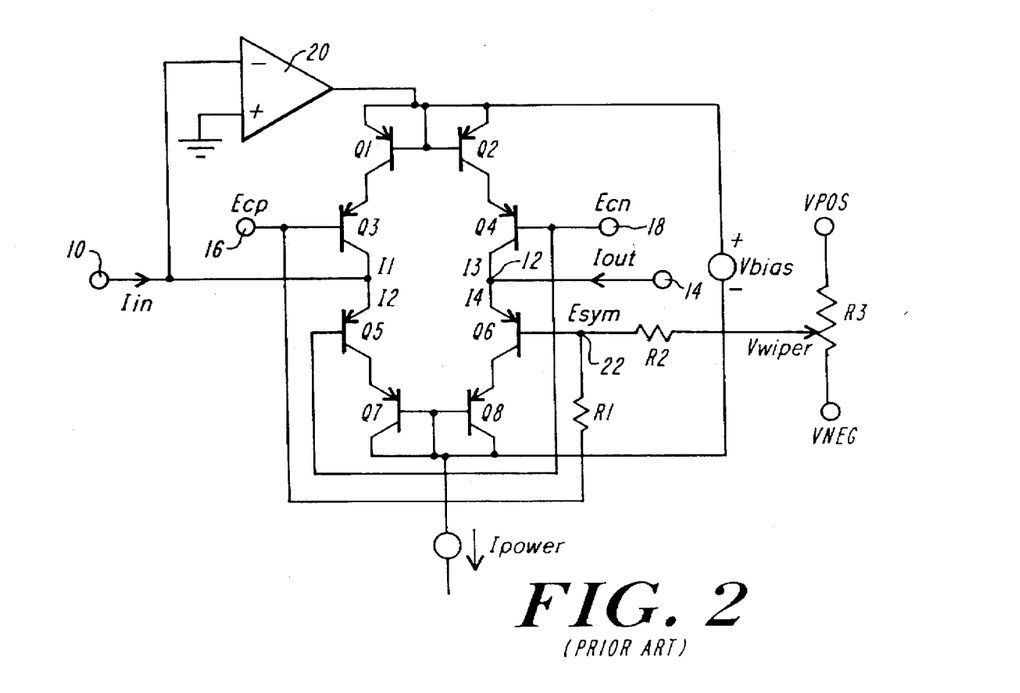
FIG. 2 is a schematic diagram of the gain control circuit shown in FIG. 1 and modified in accordance with a prior art technique of generating a symmetry adjust signal.

In considering the prior art, as each gain control circuit is made it is not necessarily known whether $E_{adj}$ should be a positive voltage, or a negative voltage. The log transistors, as well as the antilog transistors, are matched as closely as possible so that any mismatching is necessarily unpredictable and random. This would suggest therefore that just as many circuits would require a positive $E_{adj}$ as would require a negative $E_{adj}$. Accordingly, the source of $E_{adj}$ not only should include the means for adjusting the level of $E_{adj}$ in order to correct for $V_{be}$-$I_c$ mismatches, but also for adjusting the polarity of $E_{adj}$ so that $E_{adj}$ can be made positive or negative. The most common prior art approach for adjusting $E_{adj}$ to the desired polarity and value is illustrated in FIG. 2. A resistor $R_1$ is connected between the bases of antilog transistor $Q_6$ and log transistor $Q_3$, and a resistor $R_2$ is connected between the base of transistor $Q_6$ and the wiper of a potentiometer $R_3$. The ends of potentiometer $R_3$ are connected between potentials $V_{pos}$ and $V_{neg}$ (typically, but not necessarily, equal and opposite voltages) to create a variable potential at the wiper. The values of these components are typically chosen such that the resistance of $R_2$ is much larger than the resistance of $R_3$, and the ratio of $R_2$ to $R_1$ is chosen to restrict the range of voltages across $R_1$, to the few millivolts necessary to correctly adjust the VCA symmetry. Further, $R_1$ is typically chosen to be less than 100 ohms so as not to add excessively to the base resistance of antilog transistor $Q_6$. Finally, $E_{cp}$ is typically driven by a very low-impedance voltage source. Under these conditions $E_{sym}$ may be approximated by:

$$E_{sym} = V_{wiper}\left(\frac{R_1}{R_1+R_2}\right) + E_{cp}\left(\frac{R_2}{R_1+R_2}\right) \qquad (8)$$

where $V_{wiper}$ is the voltage at the wiper of $R_3$. The net adjustment voltage $E_{adj}$ developed across $R_1$ will be:

$$E_{adj} = E_{sym} - E_{cp} = V_{wiper}\left(\frac{R_1}{R_1+R_2}\right) + \quad (9)$$

$$E_{cp}\left(\frac{R_2}{R_1+R_2} - 1\right) = (V_{wiper} - E_{cp})\left(\frac{R_1}{R_1+R_2}\right)$$

The symmetry adjustment is typically made with $E_{cp}$ and $E_{cn}$ both set to 0 volts so that the current gain of the VCA is unity. As can be seen from equation (9), if the positive-sense gain control port 16 is then used for adjusting the gain of the VCA, either in conjunction with or instead of the negative-sense gain control port 18, the $E_{adj}$ potential will deviate from the desired value as the $E_{cp}$ potential is varied. This leads to degraded distortion and offset-versus-gain performance at gains other than unity.

When this technique is implemented using discrete components for $R_1$, $R_2$, and $R_3$, approximate temperature compensation of the $E_{adj}$ potential can be achieved by using a temperature-dependent resistor for $R_1$. If $R_2$ is much larger than $R_1$ (which is typically the case) and $R_1$'s value varies 0.33% for every one degree centigrade variation from room temperature while $R_2$'s value remains fixed, then $E_{adj}$ will vary approximately PTAT fashion. Of course, it is difficult to ensure that the discrete resistor stays at exactly the same temperature as transistors $Q_1$ through $Q_2$. While integrating the resistors onto the same IC with the transistors might solve this problem, it is difficult with current IC technology to fabricate integrated resistors with specific, well-controlled temperature coefficients.

OBJECTS OF THE INVENTION

A principal object of the present invention is to reduce or substantially overcome the disadvantages described above in connection with the prior art.

Another object of the present invention is to adjust at the wafer stage for the correction of mismatches between or among circuit components which are a part of the same integrated circuit structure so that the components are matched over a temperature range.

And another object of the present invention is to provide means, on the same integrated circuit incorporating a gain-control circuit, for providing proper symmetry adjustment for mismatches in the $V_{bc}$-$I_c$ characteristics between or among transistors independently of temperature variations.

Still another object of the present invention is to implement a gain control circuit of the type having two gain control ports so that symmetry adjustment is unaffected by the potential at either of the two gain control ports, thus leaving them both available for use.

Yet another object of the present invention is to exploit the use of resistors, fabricated in accordance with IC manufacturing techniques, that track over a wide range of temperatures, in providing symmetry adjustment for a gain control circuit implemented in IC form.

And still another object of the present invention is to provide an adjustable bipolar symmetry adjustment signal to one or more transistors of a transistor cell of a gain control circuit so that the polarity and level of the symmetry adjustment signal can be appropriately adjusted during the manufacture of the gain control circuit as a wafer so as to substantially eliminate the need to compensate for any mismatches in the transistors following manufacture.

And yet another object of the present invention is provide a symmetry adjust signal to a gain control integrated circuit, independent of the absolute power supply used with the integrated circuit over a reasonable range of voltage levels of the power supply.

SUMMARY OF THE INVENTION

These and other objects of the invention are achieved by an integrated circuit of the type having at least two components, each of which operate interdependently as a function of temperature and at least one physical parameter associated with each of the components when implemented in integrated form. The circuit further includes compensation means, disposed in the integrated circuit, for generating and applying a bipolar compensation signal to at least one of the components so that the level and polarity of the bipolar compensation signal can be adjusted during the manufacture of the integrated circuit such that the two components interdependently operate predictably, consistently and independently of temperature variations and differences between the physical parameter of the two components.

Preferably, the integrated circuit is of the type that comprises a gain control circuit for generating an output signal as a function of the product of an input signal and a gain control signal. The gain control circuit includes at least two transistors required to be matched so that the operational characteristics of the transistors are identical in order to minimize signal distortion by the gain control means. In accordance with the present invention, the integrated circuit further includes means, disposed within the integrated circuit, for generating a bipolar signal for providing symmetry adjustment between the two transistors as a function of any mismatch between the $V_{be}$-$I_c$ characteristics of the transistors so that the transistors' operation is matched independently of temperature variations and the gain control signal.

DETAILED DESCRIPTION OF THE DRAWINGS

In the drawings, the same letters and numbers are used to identify the same or similar parts.

Figure 3:
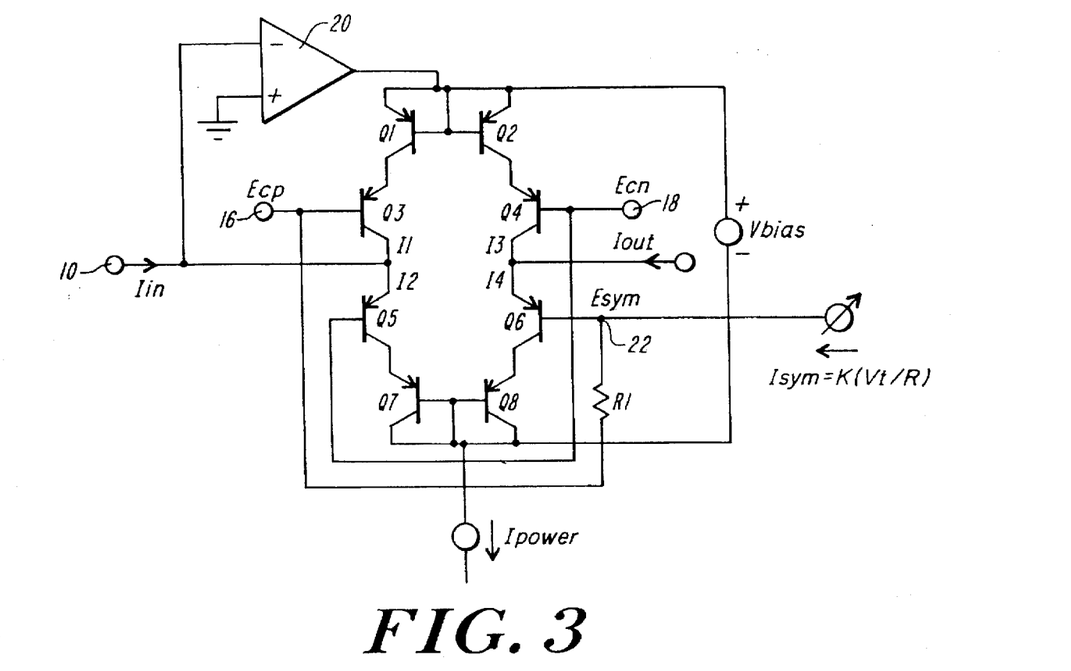
FIG. 3 is a schematic diagram of a first preferred embodiment of the present invention for providing a symmetry adjust signal as a function of a compensation current.

A preferred embodiment for achieving proper symmetry adjustment independent of temperature variations and gain-control voltages is illustrated in FIG. 3. In this embodiment a variable current source $I_{sym}$ is connected to the base of antilog transistor $Q_6$, replacing the resistor $R_2$ and potentiometer $R_3$ shown in FIG. 2. The magnitude of $I_{sym}$ is proportional to $V_T/R$ where R is a resistance having characteristics (primarily temperature coefficient) matching those of $R_1$. The resulting symmetry adjustment potential $E_{adj}$ will be approximately:

$$E_{adj} = E_{sym} - E_{cp} = KV_T \left( \frac{R_1}{R} \right) \quad (10)$$

if $I_{sym}$ is much greater than the base current of transistor $Q_6$.

Figure 4:
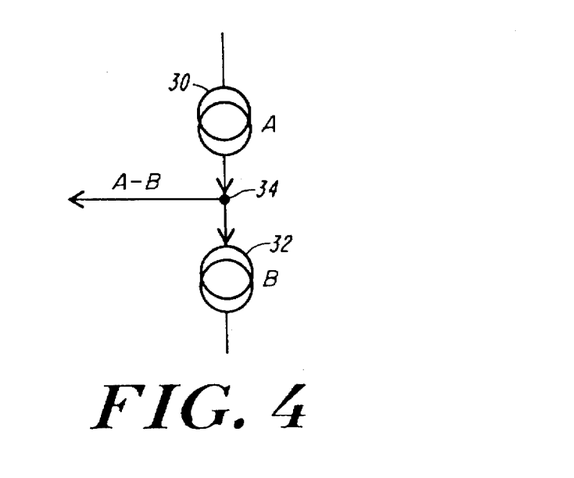
FIG. 4 is a schematic diagram showing a general implementation of a bipolar current source for producing the symmetry adjust signal.

A bipolar current source circuit with such characteristics, and which can be implemented in IC form, is shown in FIG. 4.

In FIG. 4, a positive current source 30 provides a positive current A into junction 34, while the negative current source 32 provides a negative current B from junction 34. The sources 30 and 32 are designed so that the output of each is proportional to $V_T/R$. Thus (A−B) is proportional to $V_T/R$ whether the magnitude of A is greater than the magnitude of B (A>B), or the magnitude of A is less than the magnitude of B (A<B). The exact value of A−B is $I_{sym}$, and as described above $I_{sym}$ is proportional to $V_T/R$ where R is a resistance having characteristics (primarily temperature coefficient) matching those of $R_1$ of FIG. 2. One such example of a known unipolar current source for providing a current proportional to absolute temperature is illustrated in FIG. 5.

Figure 5:
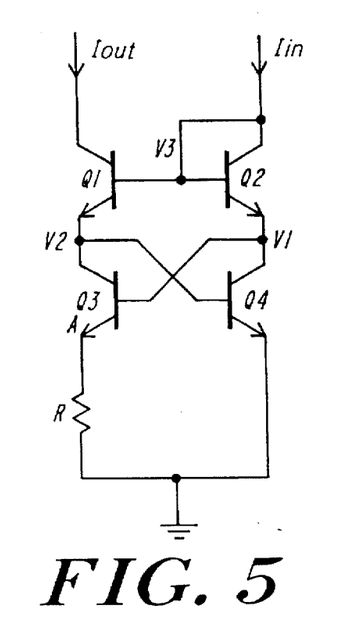
FIG. 5 is a schematic diagram showing a more detailed implementation of one of the current sources shown in the FIG. 4 embodiment.

In FIG. 5, a pair of npn transistors $Q_1$ and $Q_2$ are connected so that the collector of transistor $Q_2$ receives an input current $I_{in}$, while the collector of transistor $Q_1$ provides the output current $I_{out}$. The collector and base of transistor $Q_2$ are tied together and to the base of transistor $Q_1$ with the voltage at the juncture being defined as $V_3$. Transistors $Q_3$ and $Q_4$ are also provided, with the collector and base of transistor $Q_3$ connected respectively to the base and collector of transistor $Q_4$, with the emitter of transistor $Q_3$ connected through resistor R to system ground, and the emitter of transistor $Q_4$ connected to system ground. The emitter of transistor $Q_1$ is connected to the collector of transistor $Q_3$, and the emitter of transistor $Q_2$ is connected to the collector of transistor $Q_4$. The voltage at the juncture of the emitter of transistor $Q_1$, the base of transistor $Q_4$ and the collector of transistor $Q_3$ is defined as $V_2$, while the voltage at the juncture of the emitter of transistor $Q_2$, the base of transistor $Q_3$ and the collector of transistor $Q_4$ is defined as $V_1$. Assuming that transistors $Q_1$, $Q_2$, and $Q_4$ have identical characteristics (including saturation current $I_s$) and that transistor $Q_3$ is similar, but with emitter area A times larger than the other three, and ignoring base currents, the following can be stated from inspection of FIG. 5:

$$V_1 = I_{out}R + V_T \ln \left( \frac{I_{out}}{AI_s} \right) \quad (11)$$

$$V_2 = V_T \ln \left( \frac{I_{in}}{I_s} \right) \quad (12)$$

$$V_3 = V_2 + V_T \ln \left( \frac{I_{out}}{I_s} \right) = V_1 + V_T \ln \left( \frac{I_{in}}{I_s} \right) \quad (13)$$

Substituting the first two equations into the third yields:

$$V_T \ln \left( \frac{I_{in}}{I_s} \right) + V_T \ln \left( \frac{I_{out}}{I_s} \right) = I_{out}R + V_T \ln \left( \frac{I_{out}}{AI_s} \right) + \quad (14)$$

-continued $$V_T \ln \left( \frac{I_{in}}{I_s} \right)$$

and solving for $I_{out}$:

$$V_T \ln \left( \frac{I_{out}}{I_s} \right) = I_{out}R + V_T \ln \left( \frac{I_{out}}{AI_s} \right) \quad (15)$$

$$I_{out} = \frac{V_T}{R} \ln A \quad (16)$$

It should be noted that the assumption that base currents may be ignored in the foregoing analysis will be valid if the magnitude of $I_{in}$ is of the same order as that of $I_{out}$. It should also be noted that small mismatches among the transistors will have the effect of slightly altering the value of the constant A.

Figure 6:
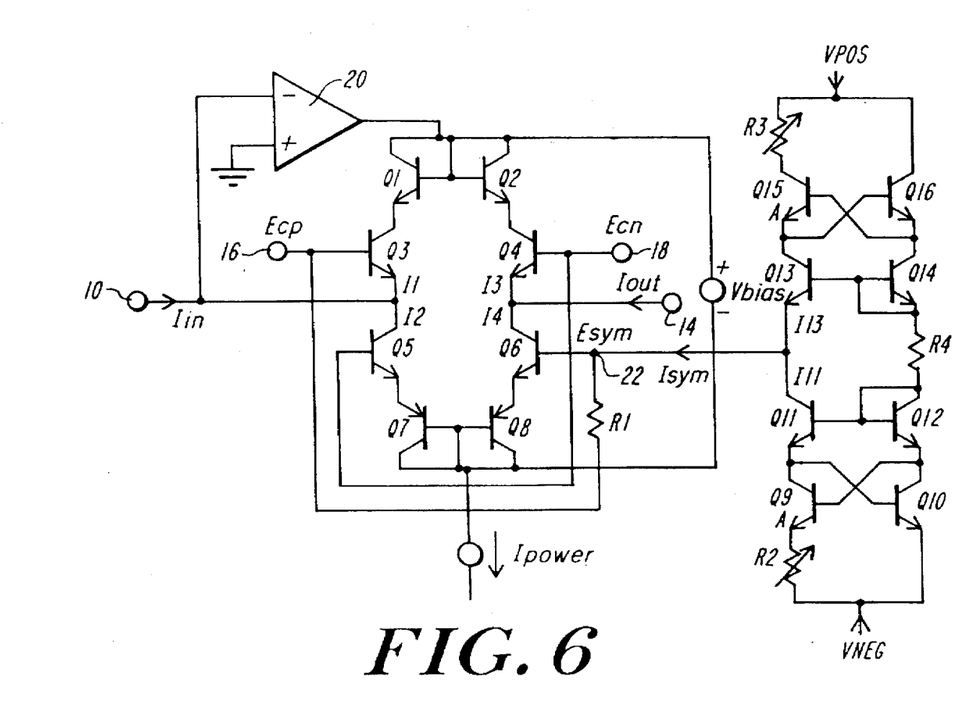
FIG. 6 is a schematic diagram showing a more detailed implementation of the FIG. 4 embodiment.

A current source such as that shown in FIG. 5 will not fulfill the requirements of $I_{sym}$ in FIG. 3 because $I_{sym}$ must be bidirectional or bipolar. That is, it must be adjustable to both positive and negative values of current since the required adjustment potential $E_{adj}$ may be positive or negative. FIG. 6 shows an embodiment that fulfills all of the requirements connected to an eight transistor cell gain control circuit.

Figure 7:
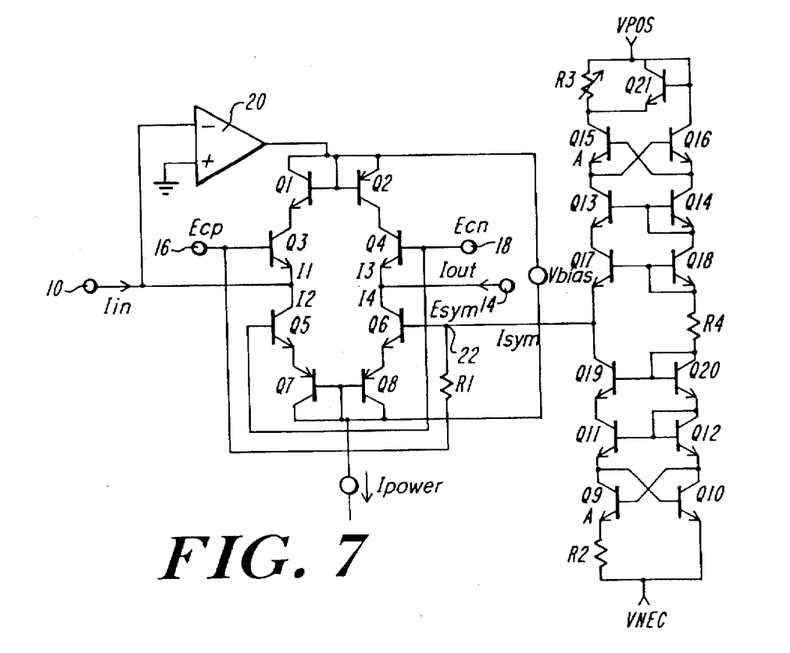
FIG. 7 is a schematic diagram showing a more detailed implementation of the FIG. 6 embodiment and the preferred embodiment.

Referring to FIG. 6, the current source includes a positive voltage rail $V_{pos}$ and a negative voltage rail $V_{neg}$. The positive voltage rail $V_{pos}$ is connected through resistor $R_3$ to the emitter of pnp transistor $Q_{15}$ and directly to the emitter of pnp transistor $Q_{16}$. The base and collector of transistor $Q_{15}$ are connected respectively to the collector and base of transistor $Q_{16}$. The base of transistor $Q_{16}$ and the collector of transistor $Q_{15}$ are connected to the emitter of pnp transistor $Q_{13}$, while the base of transistor $Q_{15}$ and the collector of transistor $Q_{16}$ are connected to the emitter of pnp transistor $Q_{14}$. The base and collector of transistor $Q_{14}$ are connected to the base of transistor $Q_{13}$, while the collector of transistor $Q_{13}$ provides current $I_{13}$. The remaining portion of the current source, including transistors $Q_9$ and $Q_{10}$ (which correspond to transistors $Q_{15}$ and $Q_{16}$), transistors $Q_{11}$ and $Q_{12}$ (which correspond to transistors $Q_{13}$ and $Q_{14}$) and resistor $R_2$ (which corresponds to resistor $R_3$) duplicates the circuit to the extent described so as to provide current $I_{11}$. $I_{sym}$ is formed as the difference between the currents $I_{13}$ and $I_{11}$. A resistor $R_4$ is provided between the collectors of transistors $Q_{12}$ and $Q_{14}$. In this circuit resistor $R_4$ sets the current through transistors $Q_{10}$, $Q_{12}$, $Q_{14}$, and $Q_{16}$ (which corresponds to $I_{in}$ in the circuit of FIG. 7) at approximately $$\frac{V_{pos} - V_{neg} - 4V_{be}}{R_4} \quad (17)$$

where $V_{be}$, represents the base-emitter forward voltage of $Q_{16}$, $Q_{14}$, $Q_{12}$ and $Q_{10}$, approximately equal to 0.7 V. This current is chosen, as mentioned above, so that it is of the same order of magnitude as the desired range of $I_{13}$ and $I_{11}$ to minimize the effects of base currents. The collector currents of transistors $Q_{11}$ and $Q_{13}$ are then (via an analysis similar to that above for FIG. 6):

$$I_{11} = \frac{V_1}{R_2} \ln A \quad (18)$$

$$I_{13} = \frac{V_T}{R_3} \ln A \quad (19)$$

$I_{sym}$ is then:

$$I_{sym} = I_{13} - I_{11} = \frac{V_T}{R_3} \ln A - \frac{V_T}{R_2} \ln A = \left( \frac{R_2 - R_3}{R_2 R_3} \right) V_T \ln A \quad (20)$$

and, thus, the adjustment potential $E_{adj}$ will be:

$$E_{adj} = E_{sym} - E_{cp} = R_1 I_{sym} = \left[ \frac{R_1(R_2 - R_3)}{R_2 R_3} \right] V_T \ln A \quad (21)$$

If resistors $R_1$, $R_2$, and $R_3$ are of like types so that they exhibit similar temperature coefficients then the adjustment potential will be PTAT as desired, and will be independent of the potential at either control port to the extent that Early effect in transistors $Q_{11}$ and $Q_{13}$ may be ignored. The potential may be adjusted by trimming resistors $R_2$ and/or $R_3$ using any of the common techniques known in the art. Resistor $R_1$ is, again, typically chosen to be less than 100 ohms in order to avoid adding significantly to the base resistance of transistor $Q_6$.

FIG. 7 shows a preferred embodiment of the current source used with a VCA, wherein cascode transistors $Q_{17}$ and $Q_{18}$ have been added in series with transistors $Q_{13}$ and $Q_{14}$ (with the emitters of pnp transistors $Q_{17}$ and $Q_{18}$ respectively connected to the collectors of transistor $Q_{13}$ and $Q_{14}$, the bases of transistors $Q_{17}$ and $Q_{18}$ connected to each other and to the collector of transistor $Q_{18}$, and the collectors of transistors $Q_{17}$ and $Q_{18}$ connected to the output of the current source and resistor $R_4$ respectively). Similarly, cascode transistors $Q_{19}$ and $Q_{20}$ have been added in series with transistors $Q_{11}$ and $Q_{12}$ (with the emitters of pnp transistors $Q_{19}$ and $Q_{20}$ respectively connected to the collectors of transistor $Q_{11}$ and $Q_{12}$, the bases of transistors $Q_{19}$ and $Q_{20}$ connected to each other and to the collector of transistor $Q_{20}$, and the collectors of transistors $Q_{19}$ and $Q_{20}$ connected to the output of the current source and resistor $R_4$ respectively). The cascode transistors $Q_{17}$ and $Q_{18}$ serve to increase the output impedance of the upper current source, as is well known in the art. Transistors $Q_{19}$ and $Q_{20}$ serve this function for the lower current source. This minimizes the effects of Early effect in the transistors and makes the circuit behave more ideally with regard to independence from changes in the potential at $E_{cp}$. The circuit is also designed so that only a single resistor, $R_3$, need be adjusted. This resistor is typically adjusted between a maximum value that is essentially an open circuit to a minimum value of $R_2/2$. This yields a range of adjustment potential of:

$$\frac{R_1}{R_2} V_T \ln A \geq E_{adj} \geq -\frac{R_1}{R_2} V_T \ln A \quad (22)$$

Diode connected transistor $Q_{21}$ is added to prevent the emitter of transistor $Q_{15}$ from floating when $R_3$ is open circuited. It ensures that current $I_{17}$ will be negligibly small under these conditions (essentially equal to the base current of transistor $Q_{16}$) while not interfering with normal circuit operation.

Figure 8:
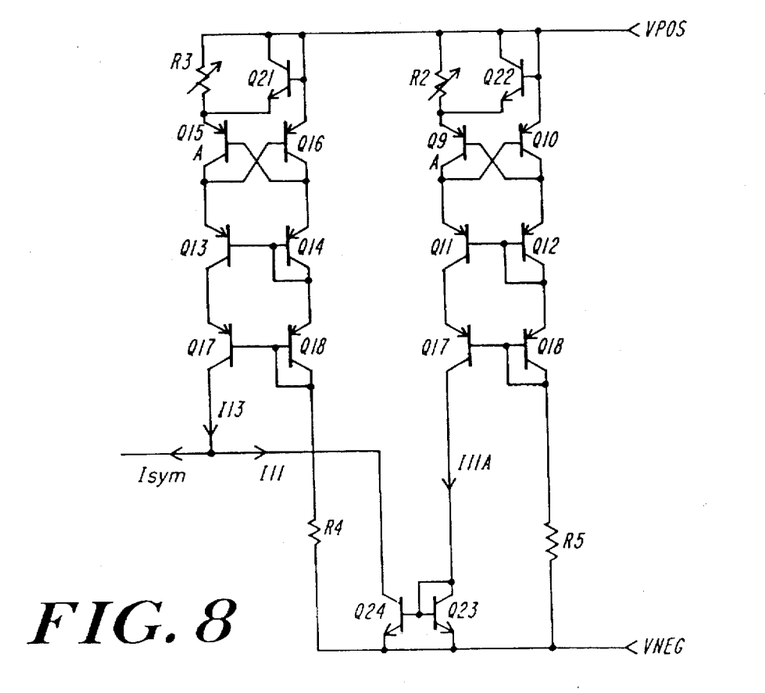
FIG. 8 is a schematic diagram of a second preferred embodiment of the present invention for providing a symmetry adjust signal as a function of a compensation current.

An alternative to the current sources shown in FIG. 7, and another preferred embodiment is shown in FIG. 8. In FIG. 8, PNP transistors $Q_{13}$–$Q_{18}$ and resistor $R_3$ function identically to the counterpart components of FIG. 7 so as to generate a current:

$$I_{13} = \frac{V_T}{R_3} \ln A \quad (23)$$

Resistor $R_4$ and diode-connected transistor $Q_{21}$ also function identically with their counterparts in FIG. 7. PNP transistors $Q_9$–$Q_{12}$, $Q_{17}$ and $Q_{18}$ and diode-connected transistor $Q_{22}$ along with resistors $R_2$ and $R_5$ (all shown to the right in FIG.

8) form an identical circuit as the circuit formed by transistors $Q_{13}$–$Q_{18}$ and $Q_{21}$, and resistors $R_3$ and $R_4$ (all shown to the left in FIG. 8) so as to generate a current:

$$I_{11A} = \frac{V_T}{R_2} \ln A \quad (24)$$

Transistors $Q_{23}$ and $Q_{24}$ form the simplest form of a current mirror circuit and are formed as two NPN transistors, wherein the NPN transistor $Q_{23}$ has its collector connected to its base and to the collector of transistor $Q_{17}$, and its emitter connected to the negative voltage rail $V_{NEG}$. NPN transistor $Q_{24}$ has its emitter connected to the negative voltage raft $V_{NEG}$, its base connected to the transistor $Q_{23}$ and its collector connected with the collector of transistor $Q_{17}$ (of the circuit portion shown in the left side of FIG. 8) to the symmetry adjust terminal 22. While NPN transistors $Q_{23}$ and $Q_{24}$ form a simple current mirror, it will be evident to those skilled in the art that other types of current mirrors can be used. The current mirror serves to replicate current $I_{11}$. This current serves the same function as its counterpart in FIG. 7.

In operation, when $I_{11A}$ (which is identical to $I_{11}$ by virtue of the current mirror) is less than $I_{13}$, $I_{sym}$ will be of a positive polarity and flow in the direction shown in FIG. 8. If $I_{11A}$ (and $I_{11}$) is greater than $I_{13}$, then $I_{sym}$ will be of a negative polarity and flow in the opposite direction from that shown in FIG. 8.

In the embodiment of FIG. 8, the PTAT current source is implemented with the same polarity devices, and referenced to the same reference voltage (in this case, $V_{pos}$) as the PTAT current source of FIG. 7. The current mirror is used to generate the opposing polarity current $I_{11}$ so that the bipolar nature of the correction current $I_{sym}$ can be realized.

With the addition of the current mirror, the implementation of FIG. 8 utilizes a few more components than the realization shown in FIG. 7, but there are occasions when it may be preferred. In the most commonly available junction-isolated bipolar IC process the vertical NPN transistors exhibit high common-base current gain over a wide range of operating currents, while the current gain of the lateral PNP transistors is typically much lower, and falls off rapidly at collector currents above a few tens of microamps. For this reason it may be desirable to implement both PTAT current sources with NPN transistors (the opposite configuration from that shown in FIG. 8).

Another occasion where the circuit of FIG. 8 may be preferred is when the wafer-stage trimming method known as "zener zapping" is used to adjust $R_2$ and $R_3$. This technique involves creating selected connections between components at wafer test by passing a short-duration high current through a zener diode. This method requires metallic connections (pads) for probe tips to be attached to both ends of each zener diode that may be selectively shorted. Having both PTAT current sources attached to the same reference voltage as in FIG. 8 allows the reference voltage node to serve as one end of all connections to be made, which reduces the required die area. Additionally, since the initial state of all selected connections is essentially an open circuit, $R_2$ and $R_3$ may be open circuits before any trimming is done. Thus, an untrimmed version of the device may be manufactured with minimum test time by merely omitting the trim procedure. This is in contrast to the circuit in FIG. 7, where in order to provide for selective connection of $R_3$, a probe pad must be added at $V_{NEG}$, which may not be required otherwise.

The compensation circuits shown in FIGS. 4–8 provide an easy way to adjust at the wafer stage for the correction of operational mismatches in circuit components which are a part of the same integrated circuit structure and which for operational purposes are required to be matched over a temperature range. More specifically, the current source $I_{sym}$ provides the means, on the same integrated circuit incorporating a gain-control circuit, for providing proper symmetry adjustment for mismatches in the $V_{be}$-$I_c$ characteristics of the transistors independently of temperature variations. The disclosed embodiments provide a way to implement a gain control circuit of the type having two gain control terminals so that symmetry adjustment is unaffected by the potential at either of the two gain control terminals, thus leaving them both available for use. The approach exploits the use of resistors, fabricated in accordance with readily available IC manufacturing techniques, that track over a wide range of temperatures, in providing appropriately temperature-dependent symmetry adjustment for a voltage controlled amplifier implemented as an IC.

It is noted that while the compensation means has been described in connection with the type of VCA shown and described in connection with FIG. 1, the invention can be employed with other types of circuits which are manufactured in IC form, and can be used with other types of VCAs, such as those shown in the two Frey patents, U.S. Pat. Nos. 4,560,947 and 4,823,093. In addition, it should be noted that the connection of the symmetry trimming circuitry to the base of transistor $Q_6$ is but one form of implementation with respect to the VCA circuit shown. It may just as easily be connected to any of the bases of the four primary log or antilog transistors ($Q_3$, $Q_4$, $Q_5$, or $Q_6$) with identical results. If the symmetry adjustment apparatus were connected to the base of transistor $Q_3$, then $E_{cp}$ would be applied to the base of transistor $Q_6$. If it were connected to the base of transistor $Q_4$, then $R_1$ would be connected between the bases of transistors $Q_4$ and $Q_5$, with $E_{cn}$ applied to the base of transistor $Q_5$, and $E_{cp}$ applied to the bases of transistors $Q_3$ and $Q_6$. Similarly, if it were connected to the base of transistor $Q_5$, then $R_1$ would again be connected between the bases of transistors $Q_4$ and $Q_5$, with $E_{cn}$ applied to the base of transistor $Q_4$, and $E_{cp}$ applied to the bases of transistors $Q_3$ and $Q_6$. This is true of all of the symmetry adjustment techniques described herein.

Since certain changes may be made in the above apparatus without departing from the scope of the invention herein involved, it is intended that all matter contained in the above description or shown in the accompanying drawings shall be interpreted in an illustrative and not in a limiting sense.

What is claimed is:

1. An integrated circuit comprising:
    at least two components, each of which operate interdependently as a function of temperature and at least one physical parameter associated with each of said components when implemented in integrated form;
    compensation means, disposed in said integrated circuit, for generating and applying an adjustable bipolar compensation current to at least one of said components so that the level and polarity of said compensation current can be adjusted during the manufacture of the integrated circuit such that said two components interdependently operate predictably, consistently and substantially independently of temperature variations and differences between the physical parameter of said two components,
    wherein said compensation means comprises a positive current source and a negative current source, each source includes at least one output transistor having a collector, and wherein the output transistor of the positive current source is complementary to the output transistor of the negative current source, and (a) current generated through the collector of one of said output transistors is of a positive polarity and is proportional to absolute temperature, (b) current generated through the collector of the other of said output transistors is of a negative polarity and is proportional to absolute temperature, and (c) the positive polarity current is greater than the negative polarity current when the compensation current is of a positive polarity and the positive polarity current is less than the negative polarity current when the compensation current is of a negative polarity.

2. An integrated circuit according to claim 1, wherein said two components are additional transistors, wherein said additional transistors operate interdependently as a function of absolute temperature.

3. An integrated circuit according to claim 2, wherein said physical parameter is the base-to-emitter voltage ($V_{be}$) to collector current ($I_c$) characteristics of each of said additional transistors.

4. An integrated circuit according to claim 1, wherein said means for generating and applying said adjustable bipolar current includes at least a pair of transistors disposed in said integrated circuit, said adjustable bipolar compensation current is a function of the emitter area ratio of at least a pair of transistors.

5. An integrated circuit according to claim 4, wherein said integrated circuit includes a resistive element coupled to one of said components and having a predetermined resistance with a determinable temperature coefficient, and said means for generating an adjustable bipolar compensation current provides said compensation current as a function of $$\frac{V_T}{R} \ln A,$$

wherein $V_T$ is a voltage proportional to absolute temperature, R represents a resistance having a temperature coefficient characteristic matching the temperature coefficient of said resistive element, and A is the emitter area, ratio of said pair of transistors.

6. An integrated circuit according to claim 4, wherein the level and polarity of said bipolar current is a function of the emitter ratios of at least a pair of transistors of said positive current source and at least a pair of transistors of said negative current source.

7. An integrated circuit according to claim 1, wherein said means for generating and applying said adjustable bipolar compensation current includes at least four transistors, wherein three of said transistors have identical operating characteristics, and said fourth transistor is identical to each of said three transistors but includes an emitter area A times larger than the emitter area of each of the other three transistors.

8. An integrated circuit according to claim 1, wherein said means for generating and applying said adjustable bipolar compensation current includes means for generating said adjustable bipolar compensation current as a function of $$\left(\frac{R_2 - R_3}{R_2 R_3}\right) V_T$$

$\ln A$, wherein $R_2$ and $R_3$ are resistive elements having respective resistances, each adjustable during the manufacture of said integrated circuit, $V_T$ is a voltage proportional to absolute temperature and A is the emitter area ratio of at least one pair of transistors.

9. An integrated circuit according to claim 1, further including means for increasing the output impedance of each of said positive current source and the negative current source.

10. An integrated circuit according to claim 9, wherein said means for increasing the output impedance of each of said positive current source and the negative current source includes a pair of cascode transistors.

11. An integrated circuit according to claim 1, wherein one of said current sources includes (a) means for generating a first current signal, and (b) a current mirror for generating a second current signal of an opposing polarity in response to said first current signal.

12. An integrated circuit comprising:

gain control means for generating an output signal as a function of an input signal and a gain control signal, said gain control means including at least two gain control transistors required to be symmetrically matched so that the operational characteristics of said gain control transistors are identical in order to minimize signal distortion by said gain control means and by changes in operating temperature; and current source means, disposed within said integrated circuit, for generating a bipolar symmetry adjustment current so as to provide symmetry adjustment between said two gain control transistors as a function of any mismatch between said gain control transistors so that the level and polarity of said bipolar current can be adjusted during the manufacture of the integrated circuit such that said two gain control transistors operate predictably, consistently and substantially independently of temperature variations and said gain control signal;

wherein said current source means comprises a positive current source and a negative current source, each source includes at least one output transistor having a collector, and wherein the output transistor of the positive current source is complementary to the output transistor of the negative current source, and (a) current generated through the collector of one of said output transistors is of a positive polarity and is proportional to absolute temperature, (b) current generated through the collector of the other of said output transistors is of a negative polarity and is proportional to absolute temperature, and (c) the positive polarity current is greater than the negative polarity current when the symmetry adjustment current is of a positive polarity and the positive polarity current is less than the negative polarity current when the symmetry adjustment current is of a negative polarity.

13. An integrated circuit according to claim 12, wherein said gain control means includes means for generating a first signal as a logarithmic function of the input signal, and means for generating the output signal as an antilogarithmic function of the gain control signal and the first signal.

14. An integrated circuit according to claim 12, wherein said bipolar symmetry adjustment current is a function of the emitter area ratio of a pair of transistors.

15. An integrated circuit according to claim 14, wherein said integrated circuit includes a resistive element (a) coupled to at least one of said gain control transistors and (b) having a predetermined resistance with a temperature coefficient, and said means for generating said bipolar symmetry adjustment current provides said bipolar current as a function of $$\frac{V_T}{R} \ln A,$$

wherein $V_T$ is a voltage proportional to absolute temperature, R represents a resistance having a temperature coefficient characteristic matching the temperature coefficient of said resistive element, and A is the emitter area ratio of at least one pair of transistors.

16. An integrated circuit according to claim 14, wherein said means for generating said bipolar symmetry adjustment current includes at least four transistors disposed in said integrated circuit, wherein three of said transistors have identical operating characteristics, and said fourth transistor is identical to each of said three transistors but includes an emitter area A times larger that the emitter area of each of the other three transistors.

17. An integrated circuit according to claim 12, wherein the level and polarity of the bipolar symmetry adjustment current is a function of the emitter area ratios of at least one pair of transistors.

18. An integrated circuit according to claim 12, wherein said means for generating said bipolar symmetry adjustment current includes means for generating said bipolar symmetry adjustment current as a function of $$\left( \frac{R_2 - R_3}{R_2 R_3} \right) V_T \ln A,$$

wherein $R_2$ and $R_3$ are resistive elements having respective resistances, each adjustable during the manufacture of said integrated circuit, $V_T$ is a voltage proportional to absolute temperature and A is the emitter area ratio of at least one pair of transistors.

19. An integrated circuit according to claim 12, wherein said current source means further includes means for summing said positive and negative polarity currents.

20. An integrated circuit according to claim 19, wherein at least one of said positive current source and said negative current source includes means for adjusting the corresponding positive or negative polarity currents.

21. An integrated circuit according to claim 20, wherein each of said positive and, negative current sources are disposed in said integrated circuit and includes at least four transistors, wherein three of said transistors have identical operating characteristics, and said fourth transistor is identical to each of said three transistors but includes an emitter area A times larger that the emitter area of each of the other three transistors.

22. An integrated circuit according to claim 19, further including means, disposed in said integrated circuit, for increasing the output impedance of each of said positive current source and the negative current source.

23. An integrated circuit according to claim 22, wherein said means for increasing the output impedance of each of said positive current source and the negative current source includes a pair of cascode transistors.

24. An integrated circuit according to claim 19, wherein one of said current sources includes (a) means for generating a first current signal, and (b) a current mirror for generating a second current signal of opposing polarity in response to said current signal.

* * * * *

UNITED STATES PATENT AND TRADEMARK OFFICE
CERTIFICATE OF CORRECTION

PATENT NO.: 5,663,684

DATED: September 2, 1997

INVENTOR(S): Gary K. Hebert

It is certified that errors in the above-identified patent and that said Letters Patent is hereby corrected as shown below:

Claim 8, column 12, line 60, after "$V_T$", insert -- lnA, --; and line 61, before "wherein" delete "lnA,".

Signed and Sealed this

Eleventh Day of November, 1997

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,663,684

DATED : September 2, 1997

INVENTOR(S) : Gary K. Hebert

It is certified that error appears in the above-identified patent and that said Letters Patent is hereby corrected as shown below:

In Figure 1, Q5 and Q6 should be NPN instead of PNP;

In Figure 2, Q5 and Q6 should be NPN instead of PNP;

In Figure 3, Q1, Q2, Q5 and Q6 should be NPN instead of PNP;

In Figure 6 and cover figure, Q3, Q4, Q13, Q14, Q15 and Q16 should be PNP instead of NPN; and In Figure 7, Q3, Q4, Q13, Q14, Q15, Q16, Q17 and Q18 should be PNP instead of NPN.

Signed and Sealed this

Twenty-third Day of December, 1997

Attest:

BRUCE LEHMAN

*Attesting Officer*  *Commissioner of Patents and Trademarks*